(12) United States Patent
Nieland

(10) Patent No.: US 11,760,061 B2
(45) Date of Patent: Sep. 19, 2023

(54) LAMINATED FOIL STRUCTURE AND METHOD OF FORMING THE SAME

(71) Applicant: Linxens Holding, Mantes la Jolie (FR)

(72) Inventor: Carsten Nieland, Dresden (DE)

(73) Assignee: LINXENS HOLDING, Mantes-la-Jolie (FR)

( * ) Notice: Subject to any disclaimer, the term of this patent is extended or adjusted under 35 U.S.C. 154(b) by 84 days.

(21) Appl. No.: 17/103,502

(22) Filed: Nov. 24, 2020

(65) Prior Publication Data

US 2021/0154974 A1 May 27, 2021

(30) Foreign Application Priority Data

Nov. 25, 2019 (EP) .................................. 19 306 517

(51) Int. Cl.
*B32B 7/12* (2006.01)
*B23K 1/00* (2006.01)
(Continued)

(52) U.S. Cl.
CPC .............. *B32B 7/12* (2013.01); *B23K 1/0016* (2013.01); *B29C 65/02* (2013.01); *B29C 65/18* (2013.01);
(Continued)

(58) Field of Classification Search
CPC ........... B32B 7/12; B32B 15/04; B32B 27/06; B32B 27/304; B32B 27/365; B32B 37/10; B32B 3/14; B32B 2307/302; B32B 2519/02; B32B 3/08; B32B 37/0046; B32B 3/10; B32B 2307/722; B32B 2309/02; B32B 2310/08; B32B 3/266; B32B 5/142; B32B 27/08; B32B 2327/06; B32B 2369/00; B32B 2425/00; B32B 2429/00; B32B 2519/00; B23K 1/0016;
(Continued)

(56) References Cited

U.S. PATENT DOCUMENTS 5,757,073 A * 5/1998 Hoffmeyer ............... H01L 24/83
257/E23.106
6,113,724 A * 9/2000 Ogawa ..................... B29C 43/56
156/212

(Continued)

OTHER PUBLICATIONS

Dettmer, The silicon PCB, Nov. 1988, IEE Review, pp. 411-413 (Year: 1988).*

(Continued)

*Primary Examiner* — Francisco W Tschen
*Assistant Examiner* — Abhishek A Patwardhan
(74) *Attorney, Agent, or Firm* — DITTHAVONG, STEINER & MLOTKOWSKI

(57) ABSTRACT

When forming layer stacks in the presence of solder material, uncontrolled flow of the solder material at the interface of two different layers of the layer stack may significantly be mitigated by providing an area of increased pressure in the material of the overlaying foil layer. For example, the area of increased pressure may be generated during the lamination process by providing a pressure inducing structure, for instance on the underlying foil layer, which laterally surrounds the solder material and therefore, in combination with the material of the overlying foil layer, reliably confines the solder material.

9 Claims, 3 Drawing Sheets

(51) Int. Cl.
  *B32B 15/04*  (2006.01)
  *B32B 27/06*  (2006.01)
  *B32B 27/30*  (2006.01)
  *B32B 27/36*  (2006.01)
  *B29C 65/02*  (2006.01)
  *B29C 65/18*  (2006.01)
  *B32B 37/10*  (2006.01)
  *B42D 25/455*  (2014.01)
  *B42D 25/46*  (2014.01)
  *B23K 101/42*  (2006.01)
  *H05K 1/03*  (2006.01)

(52) U.S. Cl.
  CPC .............. *B32B 15/04* (2013.01); *B32B 27/06* (2013.01); *B32B 27/304* (2013.01); *B32B 27/365* (2013.01); *B32B 37/10* (2013.01); *B42D 25/455* (2014.10); *B42D 25/46* (2014.10); *B23K 2101/42* (2018.08); *H05K 1/0393* (2013.01)

(58) Field of Classification Search
  CPC ..... B23K 2101/42; B29C 65/02; B29C 65/18; B42D 25/455; B42D 25/46; B42D 13/00; B42D 25/373; B42D 25/23; H05K 1/0393; B30B 15/062
  See application file for complete search history.

(56) References Cited

U.S. PATENT DOCUMENTS

| | | | |
|---|---|---|---|
| 2007/0001859 | A1 | 1/2007 | Kayanakis et al. |
| 2007/0084719 | A1* | 4/2007 | Wickersham, Jr. ......................... C23C 14/3407 204/298.12 |
| 2015/0205046 | A1* | 7/2015 | Basavanhally ......... B32B 15/01 228/165 |
| 2015/0228616 | A1* | 8/2015 | Palm ...................... H01L 24/92 257/676 |
| 2018/0330221 | A1 | 11/2018 | Fischer et al. |

OTHER PUBLICATIONS

'Copper Properties' (Year: 2018).*
'Silicon Properties' (Year: 2019).*
Office Action for corresponding European Patent Application No. 19306517.4-1014, dated May 15, 2020, 6 pages.

* cited by examiner

LAMINATED FOIL STRUCTURE AND METHOD OF FORMING THE SAME

CROSS-REFERENCE TO RELATED APPLICATIONS

This application claims the benefit of European Patent Application No. 19306517.4, filed on Nov. 25, 2019, the contents of which are hereby incorporated herein in their entirety by this reference.

BACKGROUND

The present invention generally relates to devices and manufacturing techniques, in which two or more foil layers or material sheets are stacked and treated by pressure and heat so as to connect the two or more foil layers.

In many technical fields material layers provided in the form of foils or sheets of material have to be connected so as to form a material block that appears as a monolithic or single material block in order to provide for required robustness of the material block with respect to environmental influences and the like. One prominent example in this respect is a card-type device or any pre-form thereof, which may be used as or processed into a access control card, payment card, other smart cards, a datepage of security documents, and the like. Other technical fields, for example in the field of forming any types of labels with communication capabilities and the like, respective foil layers may have to be attached to each other by applying heat and pressure in order to obtain the respective intermediate or final product of required characteristics.

It should be appreciated that in the context of the present application a respective process for applying heat and pressure to a stack of foil layers in order to connect these material layers will also be referred to as lamination.

Also in many cases such a layer structure is prepared so as to incorporate components into the layer structure, thereby providing for superior outer appearance and/or functionality by integrating, for instance, information carrying layers, optically modified layers, and the like. Therefore, there is an increasing trend to incorporate additional functional components in the form of electronic modules, which typically require the provision of appropriately designed contact structure is so as to connect to internal and/or external components.

For example, many types of card-like devices are equipped with one or more electronic modules in order to store sensitive information and respond to an externally applied signal, for instance by enabling access to a portion of the internally stored information, and the like. For example, respective payment cards have typically implemented therein one or more electronic modules that enable initiation of payment transactions upon being supplied with an external signal, for instance by a corresponding reader device, and the like. In other cases, additional functionality may be incorporated into a respective card-type device, for instance, by incorporating sensor devices, such as touch sensitive sensors, finger print sensors, or any other components imparting desired input/output capabilities, and the like, to the card-type device, thereby even further increasing the need for appropriate electrical connections between respective electronic modules that have to be incorporated into the laminated structure.

Moreover, typically respective wireless communication capabilities may require device internal electric connections, formed within a single layer or across two or more individual material layers, thereby also requiring an appropriate overall contact structure between an electronic module including RF (radio frequency) electronic components and any module external electronic components, such as capacitors, inductors, an antenna structure, and the like.

Consequently, appropriate techniques and materials have been developed, which may allow the lamination of two or more foil layers, wherein at least one of these layers may be equipped with appropriate contact structures that may have formed thereon or therein an appropriate solder material so as to enable electric contact to the conductors at any appropriate phase of the overall manufacturing process. Conventionally, such solder materials have to be selected with respect to their characteristics in view of meeting electronic requirements associated with conductivity as well as requirements with respect to melting temperature so as to be compatible with the overall process conditions that are typically encountered during the entire chain of manufacturing processes from the individual foils to the final laminated product. For example, when laminating specific foil layers, such as PVC foil layers, respective conditions during the lamination process are required in terms of appropriate pressure and temperature so as to achieve the "flow" of material and the connection of the individual foil layers. When such process conditions have to be applied in the presence of a solder material it is important to restrict a potential migration of the solder material to specified areas within the laminated structure. To this end, typically solder materials have to be used, for which the melting temperature is above the temperature that has to be applied during the lamination process. In this manner, any undesired flow of solder material may be prevented during the lamination process.

For a plurality of applications, however, it would be highly desirable to use a specific solder material having a relatively low melting temperature, for example 150° C. and less, which therefore imposes significant restrictions with respect to selecting foil materials. That is, for low melting solder materials conventionally foil materials with low process temperature during the lamination process are used in an attempt to avoid melting of the solder material, thereby excluding a wide class of foil material, such as polycarbonate materials, which may typically have a relatively high processing temperature of 170 to 190° C. during a lamination process. On the other hand, when using a "low melting" solder material in combination with plastic material of "high" process temperature the solder material will become liquid and therefore flow, in particular, when a respective pressure has to be applied during the lamination process.

When performing a lamination process by applying heat and pressure in order form a layer stack device, generally a plurality of such devices are provided as a two dimensional array on a respective carrier material and these devices arranged in a two-dimensional configuration are exposed to the process conditions of increased temperature and pressure, thereby inevitably creating to slightly differing local process conditions, in particular with respect to the locally applied pressure. Consequently, the flow of a respective melted solder material may significantly depend on the local pressure distribution across the entire carrier material, thereby resulting in unpredictable flow paths of the solder material, which in turn may result in unpredictable characteristics of the layer stack devices after the lamination process, thereby making the combination of a low melting solder material and a high temperature foil material less than desirable.

Since in some techniques the provision of a solder material of low melting temperature, i.e. a melting temperature of 150° C. and less, is highly desirable in terms of establishing reliable electric connections at any appropriate manufacturing phase, and since the usage of foil materials having a moderately high processing temperature during the lamination process is highly desirable in view of certain characteristics of the stack layer structure under consideration, it is an object of the present invention to provide means for increasing flexibility in combining solder materials and foil layer materials while avoiding or at least reducing one or more of the effects described above.

Generally, the present invention is based on the concept that solder material, even if being in a melted state, may reliably be laterally confined during a lamination process by implementing a "sealing" function during the lamination process. To this end, it has been recognized by the inventor that a zone or area of increased pressure may be generated locally in the foil layer to be connected to an adjacent layer, thereby resulting in efficiently blocking potential flow paths at an interface between the two layers to be laminated, thereby laterally confining the solder material, even when being in melted state. That is, by ensuring that a zone or an area of increased pressure is locally established during the lamination process it is also ensured that a sealing mechanical contact is established between the two foil layers to be laminated, thereby at least reducing the probability for melted solder material to spread into neighbouring regions upon laminating two foil layers, at least one of which may include the solder material. Consequently, the respective solder material may reliably be sealed at the beginning and also during the entire lamination process, wherein the respective zone or area of increased pressure may be formed on the basis of a permanently applied pressure inducing structure or on the basis of a temporarily applied structure.

SOME EXAMPLE EMBODIMENTS

Based on the concept discussed above, according to one aspect of the present invention the above-referenced technical object is solved by a method of forming a laminated foil layer stack. The method includes providing a first foil layer that includes a layer portion with a contact area having formed thereon a solder material. The method further includes positioning a second foil layer adjacent to the first foil layer, wherein the second foil layer has an opening extending through the second foil layer and exposing the solder material. Furthermore, the method includes defining an area of increased pressure locally in the foil layer so as to laterally surrounding the opening. Moreover, the method includes applying pressure and heat to said first and second foil layers so as to build up increased pressure in the area of increased pressure and laminate the second foil layer to the first foil layer, wherein the area of increased pressure laterally confines the solder material.

According to this aspect of the present invention the second foil layer has formed therein an appropriate opening so as to expose the solder material, wherein during the lamination process the defined area of increased pressure results in a local increase of pressure around the opening. In this manner, it is ensured that upon performing the lamination process the opening that exposes the solder material is surrounded, that is, laterally enclosed, by material with increased internal pressure, which in turn leads to increased pressure acting on that portion of the interface of the first and second layers that is at the area of increased pressure, thereby inducing a sealing effect, should the solder material be in or transformed into a melted state. Therefore, any potential flow path for the solder material at the interface of the two layers may reliably be "sealed" or blocked at the pressure-increasing area immediately upon applying increased pressure to the foil layer stack, irrespective of whether process related pressure variations may be present across the two-dimensional region covered by the first and second foil layers. Consequently, irrespective of the melting temperature of the solder material and the temperature required during laminating the first and second foil layers a potential uncontrolled spread of solder material is avoided or at least significantly reduced and therefore increased flexibility may be accomplished when combining a desired solder material with certain types of foil layer materials in order to meet specific design criteria of the laminated foil layer stack, thereby enabling further processing on the basis of the desired solder material and/or providing the required device characteristics of a final product.

In one illustrative embodiment a temperature of the solder material upon applying pressure and heat to the first and second foil layers exceeds a melting temperature of the solder material. As already discussed above, in many applications it is highly desirable to use a low melting solder material so as to enable appropriate processing of the laminated first and second foil layers, while the actual lamination process may require a temperature above the melting temperature of the solder material. Therefore, combinations of foil layer materials and solder materials may be used in accordance with the principles of the present invention, which may conventionally be not viable, since respective process related pressure variations are less than the increased pressure induced by the area of increased pressure, thereby reducing uncontrolled and unpredictable flow parts of a melted solder material, as discussed above.

According to a further illustrative embodiment, the step of defining an area of increased pressure locally in the second foil layer includes the provision of a pressure inducing structure that has increased thermal and mechanical strength compared to a base material of the second foil layer. By providing the pressure inducing structure of increased thermal and mechanical strength it is ensured that from the beginning of the lamination process and throughout the entire lamination process the superior thermal and mechanical characteristics of the pressure inducing structure generate a sealing effect with respect to the solder material that is laterally confined by the pressure inducing structure. That is, upon applying pressure to the first and second foil layers the superior mechanical strength of the pressure inducing structure results in a firm mechanical contact between the first and second foil layers during the lamination process, since the pressure inducing structure is less responsive to the externally applied pressure, i.e., less compressible, compared to the rest of the material of the second foil layer, thereby reliably transferring the pressure to the relevant interface portion and increasing the mechanical contact force between first and second foil layers at the area of increased pressure. Furthermore, the more robust thermal stability of the pressure-inducing structure also results in the required stability of the pressure-inducing structure during the course of the lamination process and thus substantially prevents any flow of melted solder material during the entire lamination process, until the temperature is lowered to a value, at which the melted solder material again solidifies. The pressure inducing structure may be formed on or in the second foil layer and/or on or in the first foil layer in order to define the area of increased pressure locally in the second layer. Consequently, a high degree of flexibility is established, since the pressure inducing structure may be implemented in one or both of the first and second foil layers at any appropriate manufacturing stage, thereby avoiding, in some embodiments, additional process steps or at least maintaining additional efforts or additional process steps for implementing the pressure inducing structure at a low level.

In a further illustrative embodiment the step of providing the pressure inducing structure includes the step of forming the pressure inducing structure by modifying a portion of the second foil layer so as to establish the increased thermal and mechanical strength prior to applying heat and pressure to the first and second foil layers. The modification of a portion of the second foil layer may be accomplished by any appropriate technique that results in a modification of the material characteristics. For example, the portion may be subjected to a local treatment that may result in a local increase of material density, a local increase of material volume, and the like in order to provide for the pressure inducing characteristics during the subsequent lamination process. For example, modifications of a portion of the material of the second foil layer may be accomplished by a local heat treatment, for instance, a laser irradiation, a locally applied heat radiation, by contact heating, by radiation based on high energetic photons or particles, such as electrons, X-rays, and the like. In other cases, plasma induced "damaging" of the material portion under consideration may also results in significantly modified material characteristics so as to establish the superior thermal and mechanical strength. In still other cases, a local chemical treatment may be performed in order to obtain the pressure inducing structure.

In a further illustrative embodiment the provision of the pressure inducing structure includes the positioning of the pressure inducing structure in/on and/or adjacent to the second foil layer. In this case, the pressure inducing structure may be positioned in the second foil layer, for instance by incorporating a corresponding structure in the form of a wire structure, i.e., an embedded wire structure, thereby reliably increasing the local thermal and mechanical strength of the pressure inducing structure, which in turn will lead to the pressure inducing effect of the structure during the lamination process. In still other cases the pressure inducing structure may be positioned adjacent to and adhered to the second foil structure, for instance on a surface to come into contact with the first foil layer during the lamination process and/or on the opposite surface that faces away from the first foil layer. For example, the second foil layer may be prepared during the manufacturing process thereof so as to have incorporated therein or attached thereon at one or both surfaces the respective pressure inducing structure, wherein the respective structure may be formed during the manufacturing process for the foil layer or the respective pressure inducing structure may formed separately and may then be attached to the second foil layer at any appropriate manufacturing stage.

In a further illustrative embodiment the pressure inducing structure is temporarily positioned above the second foil layer and is removed after lamination of the second foil layer to the first foil layer. In this case, the second foil layer may be formed without requiring any modifications and the pressure inducing structure may be positioned above the second foil layer by any appropriate positioning technique and may be removed after completion of the lamination process. Consequently, the pressure inducing structure that is positioned so as to be removable may be provided in the form of any appropriate template during the lamination process in order to generate the increased pressure in the area of increased pressure in the second foil layer. To this end, in some illustrative embodiments, the respective pressure inducing structure may be incorporated in a respective "pressure plate", that is, any two-dimensional component for applying pressure to the second foil layer during the lamination process. Therefore, the corresponding pressure inducing structure may be removed upon removing the pressure plate. Using a temporarily provided pressure inducing structure, for instance in the form of a patterned portion of a pressure plate, and the like, may enable the production of the second foil layer in a substantially non-modified manner, thereby avoiding any additional process steps during the entire manufacturing process compared to a conventional manufacturing process. In other embodiments, the pressure inducing structure may be attached to the pressure plate so as to be removable and may firmly connect to the second foil layer during the lamination process, thereby becoming a portion of the second foil layer while allowing removal of the pressure plate from the second foil layer.

In one advantageous embodiment providing the pressure inducing structure includes the positioning of the pressure inducing structure on the first foil layer. According to this concept, any appropriate structure that may play the role of the pressure inducing structure is positioned on the first foil layer, which may be accomplished by providing any appropriate structure on the first foil layer at any appropriate manufacturing stage prior to positioning the second foil layer adjacent to the first foil layer. For example, the pressure inducing structure may be formed as a separate component and may be placed on the first foil layer at any appropriate time during the entire manufacturing process. The placing of the pressure inducing structure may include positioning the pressure inducing structure and fixing the same by any appropriate means, such as on adhesive, and the like, thereby permanently attaching the pressure inducing structure to the first foil layer at any appropriate manufacturing stage. In other cases, the pressure inducing structure may be placed on the first foil layer when attached to an appropriate carrier material prior to positioning the second foil layer. In this case, additional steps for fixing the pressure inducing structure to the first foil layer may be omitted as long as a stable positioning of the pressure inducing structure is guaranteed. In other cases the pressure inducing structure may be formed as a protruding structure by locally depositing any appropriate material with appropriate lateral size and shape so as to comply with the requirements of pressure inducing structure. To this end, a plurality of process techniques, such as printing techniques, and the like are available so as to deposit material for the pressure inducing structure with a required two-dimensional size and shape.

In one advantageous embodiment the pressure inducing structure is formed together with a conductor pattern of the first foil layer in one and the same process. That is, when forming the conductor pattern of the first foil layer, thereby also providing the contact area for the solder material, also the pressure inducing structure may be formed without requiring any additional process steps. For instance, the conductor pattern may be formed on the basis of copper material or any other appropriate conductive material and appropriate techniques, such as lithography in combination with etch techniques, selective deposition techniques based on appropriate precursor materials in combination with additional deposition processes for copper-based materials, and the like, may effectively be used as to provide the conductor pattern and the pressure inducing structure in the same process step. That is, irrespective of the process technique used for forming the conductor pattern of the first foil layer at the same time the pressure inducing structure may be applied with any desired lateral size and shape without adding additional process complexity to the overall manufacturing process. As is typically known in this field of technology, respective conductive traces for the conductor pattern may be applied with a respective thickness, for instance using copper material with a thickness of approximately 10 to 25 μm so that the pressure inducing structure provides a respective extra height on the first foil layer corresponding to the thickness of the base material of the conductor material, such as copper, and the like. Upon positioning the second foil layer adjacent to, for example above, the first foil layer and applying pressure to the first and second foil layers the pressure inducing structure will create a respective local high pressure within the second foil layer, resulting in an increased contact force at the interface between the first and second layers at the area of increased pressure, while the opening in the second foil layer will nevertheless expose the contact area and the solder material formed thereon. In this manner, a typical process sequence may be applied without adding additional process steps, while nevertheless efficiently sealing any potential flow paths of the melted solder material, as discussed above.

In a further illustrative embodiment, the method includes the step of determining in advance a final lateral size and shape of the opening in order to determine dimensions of the solder material after having applied pressure and heat to the first and second foil layers. To this end, in illustrative embodiments, the characteristics of the materials of the first and second foil layers may be determined in advance, for instance by simulation and/or experiments, in which the respective deformation of the respective base materials may be determined when subjected to lamination. In this manner, a modification of the initial lateral size and shape of the opening that extends through the second foil layer may be determined and thus the expected final lateral size and shape may be obtained in advance with a moderately high degree of accuracy. Therefore, even if a plurality of stacked structures is processed during a common process sequence, well defined lateral dimensions of the confined solder material may be obtained. Consequently, since in some illustrative embodiments, the lateral size and dimension may define the lateral size and shape of the solder material during the lamination process and thus during a possible further possessing of the layer stack, repeatability and uniformity of respective contacts formed of solder material may be ensure consistent characteristics of the resulting products, irrespective of any pressure fluctuations occurring across a carrier material that bears a plurality of layers stacks during the lamination process.

According to another aspect of the present invention the above-identified technical object is solved by a laminated foil layer structure. The structure includes a first foil layer including a solder material that is formed at and around a contact area. Furthermore, the laminated foil layer includes a second foil layer that is formed in contact with the first foil layer and includes an opening that extends through the second foil layer and laterally surrounds the solder material. Furthermore, the laminated foil layer structure includes a high-density portion formed in the second foil layer so as to laterally enclose the opening, wherein a material density of the high-density portion is higher than a material density of the remaining material of the second foil layer.

The portion of increased material density in an area that laterally surrounds the opening of the second foil layer, which in turn encloses the solder material, provides for superior confinement of the solder material. This may be particularly advantageous, when the laminated foil layer structure has to undergo a further process step requiring a heat treatment based on a temperature that may be above the melting temperature of the solder material. Also in this case, the melting solder material may reliably be confined within the lateral dimensions and the lateral shape defined by the high-density portion. As already discussed above, according to this concept providing a high-density portion so as to laterally surround the solder material increased flexibility in providing respective foil layer structures may be achieved, since process temperatures well above the melting temperature of a respective solder material may be applied during the processing of the foil structure. In particular, as already discussed above, during the lamination of the foil layer structure undesired an uncontrolled flow of melted solder material may be avoided or at least significantly mitigated, thereby contributing to overall product reliability of an end product or an intermediate product, irrespective of the material used for one or more of the foil layers of the laminated structure.

In a further illustrative embodiment the high-density portion includes at least partially a high-strength material that differs from a material of the rest of the second foil layer. That is, the high-density portion may have incorporated therein a material of superior mechanical strength, such as a metal material, plastic material of significantly higher mechanical strength compared to the base material of the second foil layer, and the like, thereby contributing to a highly reliable high-density portion, which in turn may have an advantageous effect on the mitigation of uncontrolled spread of solder material within the laminated foil layer structure.

In one illustrative embodiment, the laminated foil layer structure includes a seal structure formed on or above the first foil layer so as to laterally surround the solder material. That is, the seal structure may represent a portion of the first foil layer or may be at least in contact with the first foil layer so that a corresponding protruding material structure of increased mechanical strength is provided on or adjacent to the first foil layer, thereby obtaining the increased material density upon forming the laminated foil structure.

In one advantageous embodiment, the seal structure and the contact area are formed of a same conductive material. That is, upon forming the contact area and possibly any further conductor pattern of the first foil layer the same material may also be used for providing the seal structure, thereby contributing to a highly effective overall manufacturing process, also discussed above.

It should be appreciated that the lateral shape of a respective seal structure, which acts as a pressure inducing structure during the lamination process and results in the high-density portion, may have, in a top view, any appropriate geometric configuration, such as an annular shape, and the like. That is, a respective high-density portion acting as a pressure inducing structure during lamination is to be understood, in terms of lateral, i.e., two-dimensional, configuration as a structure that encloses a specific region, such as a contact area, without, however, requiring a "closed loop" configuration, in which the material constituting the respective enclosing structure is formed as continuous material structure. Although the configuration of a "closed loop" configuration may be advantageous in some embodiments, the respective structure may also include one or more interrupt regions, as long as a respective distance or gap size of a corresponding interrupt region is small so as to nevertheless provide a substantially non-interrupted sealing effect at an interface between the first and second foil layers upon applying external pressure and a temperature that is above the melting temperature of the solder material. For example, respective gaps or interrupt regions in the circumferential direction of the respective structure may be the range of less than 1 μm to several micrometres, if a corresponding interrupted or non-continuous configuration is considered appropriate.

BRIEF DESCRIPTION OF THE DRAWINGS

With reference to the accompanying drawings embodiments as discussed above and further additional embodiments will now be described in more detail. In the drawings, FIG. 1A schematically illustrates an exploded perspective view of two foil layers to be formed into a foil layer stack with improved confinement of a solder material according to illustrative embodiments.

DESCRIPTION OF PREFERRED EMBODIMENT

Figure 1A:
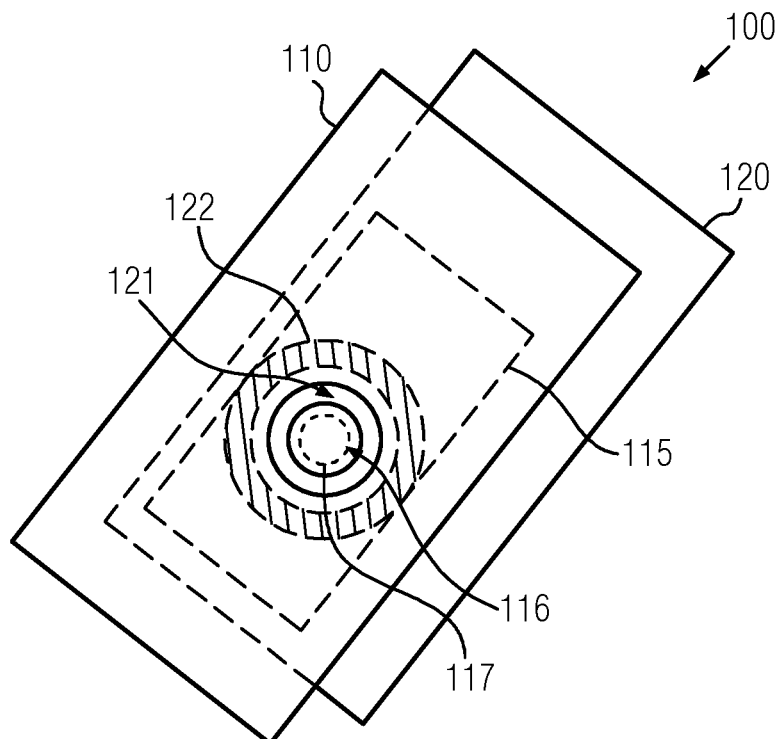
FIG. 1B schematically illustrates a cross-sectional view of the two foil layers to be stacked.
FIG. 1C schematically illustrates the foil layer stack during a process step for applying heat and pressure so as to laminate the first foil layer to the second foil layer while providing for superior confinement of a solder material on the basis of several techniques for implementing an area of increased pressure according to illustrative embodiments.
FIG. 1D schematically illustrates a cross-sectional view of a portion of the first foil layer with a pressure inducing structure according to illustrative embodiments.
FIG. 1E schematically illustrates a perspective view of a portion of a first foil layer having formed thereon a conductor pattern including contact areas with solder material and respective pressure inducing structures according to illustrative embodiments.

FIG. 1A schematically illustrates an exploded perspective view of foil layer stack 100, which may represent a final product or an intermediate product for forming devices, such as pre-forms of card-type devices, as are typically used for fabricating payment cards, and the like. In other cases the foil layer stack 100 may represent a final product or a pre-form thereof for other sheet-type devices, such as datapages of security documents, labels for any type of products including wireless communication capabilities, such as RFID labels, and the like. In this example, the stack 100 may include a first foil layer 110 having appropriate lateral dimensions as to comply with device specific requirements. The first foil layer may include a layer portion 115, which may have formed thereon or therein a contact area 116, which is to be understood as a conductive area on our within the layer portion 115.

It should be appreciated that although the layer 110 is referred to as a foil layer in the context of this application, this term is meant to also include any embodiments, in which the layer portion 115 represents a specific type of appropriate substrate material, such as a flexible carrier material used for flexible printed circuit boards, and the like, while other portions of the foil layer 110 may represent a different type of material, such as plastic material in the form of PVC, polycarbonate, and the like. Hence, the term foil layer is to be understood as any sheet-type or foil-type material layer, wherein different types of material may be present so as to meet the specific requirements of the layer of the stack 100 under consideration.

In the embodiment shown, the contact area 116 may be covered by a solder material 117, which may represent any appropriate solder material as required for forming the stack 100 and imparting a desired connectivity to the stack 100. In some illustrative embodiments, the solder material 117 may represent a solder material having a relatively low melting temperature, for instance in the range of 150° C. and less, which may frequently be encountered in the manufacturing card-type devices, such as payment cards, and the like, in which the respective electronic modules, sensor elements, and the like may have to be electrically connected with each other, at least partially, on the basis of a respective solder material.

The stack 100 may include a second foil layer 120, which may be positioned "above" or adjacent to the first foil layer 110 and may be laterally aligned to the layer 110 in order to be formed into the stack 100 on the basis of appropriate process conditions, such as applying heat and pressure, as will be described later on in more detail.

The second foil layer 120 may include an opening or hole 121 that extends through the entire layer 120 so as to expose the solder material 117. That is, the lateral size, shape and position are selected such that the solder material 117 is exposed upon connecting the layer 120 to the layer 110. Furthermore, an area of increased pressure 122 is defined in the second layer 120 so as to laterally surround the opening 121 and thus also laterally surrounding the solder material 117 after the first and second layers 110, 120 have been connected to each other.

In this context the term "defining" in the context of the area of increased pressure is to be understood such that a region is determined, in which during the application of pressure to the first and second foil layers when performing a lamination process the area 122 of increased pressure is locally formed, while without applying external pressure to the area 122, for example prior to the lamination process, similar pressure conditions may prevail in the area 122 as in other areas of the second layer 120. As will be described later on in more detail, several techniques may be applied so as to locally, i.e., in the area 122, induce increased pressure within the material of the second foil layer 120 when performing the lamination process by applying heat and pressure to the layers 110, 120.

Figure 1B:
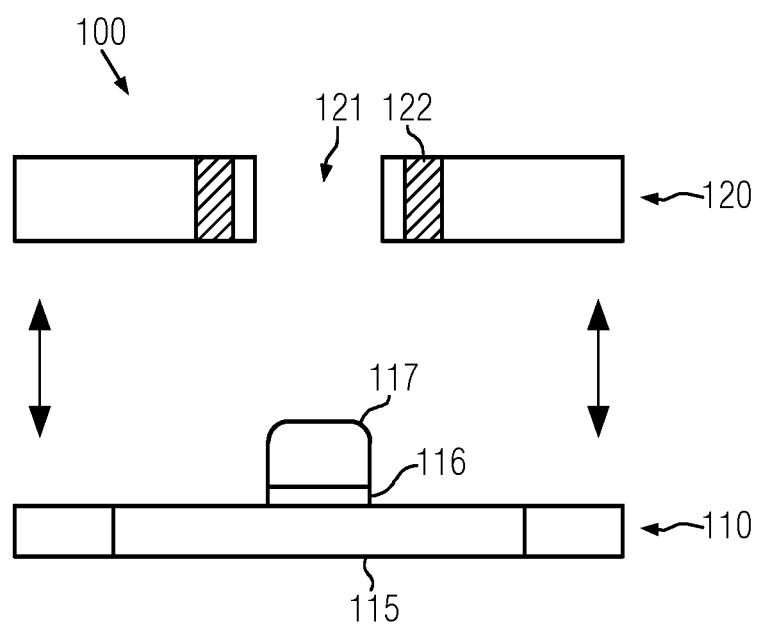

FIG. 1B schematically illustrates a cross-sectional view of the layer stack 100. As illustrated, the second foil layer 120 is positioned "above" or adjacent to the first foil layer 110 such that the opening 121 is aligned to the contact area 116 having formed thereon the solder material 117. Consequently, upon positioning the second foil layer 120 so as to be in contact with the first foil layer 110 the opening 121 laterally surrounds the solder material 117, and therefore also the area of increased pressure 122 laterally surrounds the contact area 116 and the solder material 117. Regarding the area or zone of increased pressure 122 it is to be noted that although precise boundaries are illustrated in the Figures, the skilled person will understand that the increased pressure in the area 122 actually generated during the actual lamination process pressure may vary laterally and vertically, i.e. along a height direction, which is represented in FIG. 1B as the vertical direction, within the area 122. Therefore, typically a continuous transition of a portion of increased pressure to regions of lower pressure in the vicinity of the area 122 may be observed during the actual lamination process. Moreover, it should be understood that in the state as shown in FIG. 1B the actual pressure conditions may not differ from the pressure conditions in the neighbouring regions of the layer 120 and a respective increase with respect to neighbouring material regions may build up during the actual lamination process.

Figure 1C:
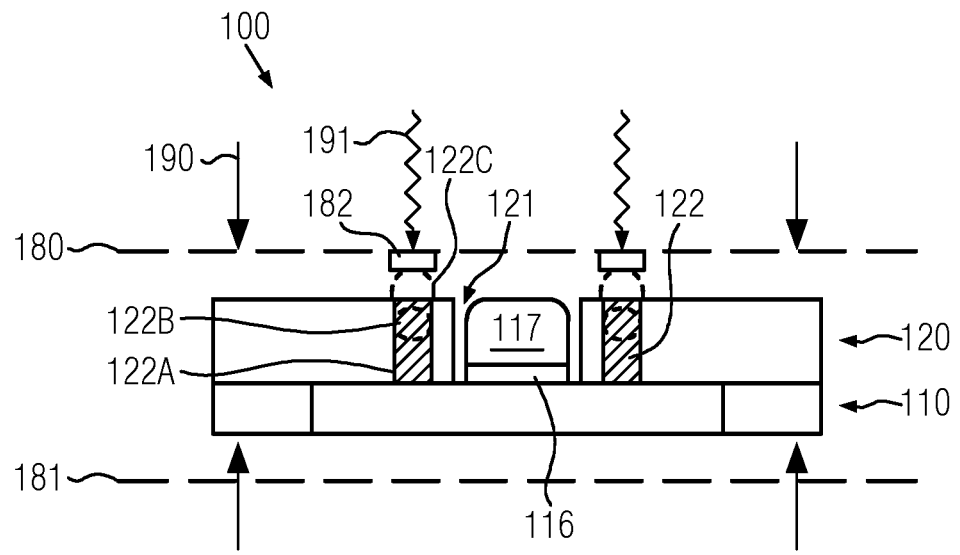

FIG. 1C schematically illustrates a cross-sectional view of the stack 100 during a process step, in which pressure, as represented by arrows 190, and heat as indicated by arrows 191, is supplied to the first and second foil layers 110, 120, which are positioned so as to be in contact with each other. Hence, as discussed above, the contact area 116 having formed thereon the solder material 117 is positioned within the opening 121 such that the solder material 117 is laterally surrounded by the opening 121, i.e., by inner side walls thereof, which in turn is laterally enclosed by the area of increased pressure 122. Upon applying the external pressure 190 to the layers 110, 120, appropriate means are provided so as to have a higher pressure in the area 122 compared to the area near the side walls of the opening 121, where the material of the layer 120 may more easily deform.

To this end, in some illustrative embodiments, at least a portion of the material within the area 122 may be modified so as to change specific material characteristics, as indicated by material 122A, so that, for example, the modified portion 122A is less compressible when subjected to the external pressure 190 compared to non-modified portions of the layer 120. Consequently, the area 122 may actually act as an area of increased pressure due to the reduced compressibility of the portion 122A, thereby also transferring increased pressure to the interface formed between the layer 110 and the layer 120. Such a modification of the portion 122A may be achieved by surface treatment, irradiation with appropriate particles and/or photons, and the like.

As previously discussed, in many cases, the melting temperature of the solder material 117 may be relatively low, instance 150° C. and less, while the heat energy 191 applied to the layer stack 100 may have to be selected so as to create a temperature above the melting temperature, thereby causing the melting of the solder material 117. Therefore, a liquid solder material 117 may spread out into the neighbouring areas at the interface between the first and second layers 110, 120, which may finally result in unacceptable characteristics of the layer stack 100. In particular, since the external pressure 190 may typically be transferred with unavoidable process variations, in particular when a plurality of layer stacks 100 have to be processed at the same time, respective flow paths at the interface between the layers 110, 120 may significantly depend on the local pressure induced by the external pressure 190.

According to the area of increased pressure 122 such typical pressure variations caused by during application of the external pressure 190 may be less relevant, since increased pressure is transferred to the interface between the layers 110, 120 at or in the vicinity of the area 122, thereby providing for increased contact force and, thus, superior sealing effect. Therefore, any potential flow paths that might otherwise be taken by the liquid solder material 117 may be blocked. Since the area of increased pressure 122 is immediately effective as soon as the external pressure 190 is applied, the associated efficient sealing effect is effective from the beginning of the lamination process and thus is effective prior to melting the solder material 117 and transforming it into a relatively low viscosity state.

In other illustrative embodiments, in addition to or alternatively to providing the modified material 122A within the zone 122 a material portion of increased mechanical strength 122B may be provided locally within the area 122, thereby also using the reduced compressibility of this portion 122B within the area 122, thereby generating increased pressure and thus obtaining a superior sealing effect, as discussed above. For example, the portion of material 122B having the increased strength may be provided in the form of a metal component, such as a wire that is embedded into the layer 120 at any appropriate manufacturing stage, while in other cases, the material of reduced compressibility may be provided in the form of a plastic material.

In still other illustrative embodiments, in addition to or alternatively to the material or portions 122A, 12AB, excess material 122C may be provided at or in the vicinity of the area 122, thereby also creating increased pressure and thus superior sealing effect upon applying the external pressure 190. The excess material 122C may be provided as substantially the same material as is used in the rest of the second foil layer 120 and may be formed on the basis of any appropriate process technique upon manufacturing the foil 120 or at any other appropriate manufacturing stage. In other cases, an appropriate structure of any appropriate material may be added to the foil 120 after having manufactured the foil layer 120 and may be permanently connected to the layer 120 by appropriate adhesive agents, lamination, and the like. For example, metal materials, other plastic materials of higher density, and the like may be used for structure 122C.

In still other illustrative embodiments in addition to or alternatively to the techniques described above with respect to portions or structures 122A, 122B and 122C a pressure applying apparatus itself may be modified so as to generate the increased pressure in the area 122. For example, the pressure 190 may be applied on the basis of a "pressure plate" 180, in combination with an appropriate counterpart 181, wherein the pressure plate 180 may have an appropriate structure 182, that is, a protruding structure 182, which, when coming into contact with the foil layer 120, will generate the increased pressure in the area 122. It should be appreciated that the structure 182 may thus represent a structure that is temporarily applied so as to induce the increased pressure in the area 122, since after removing the pressure plate 180, also the structure 182 may be removed.

In other illustrative embodiments, the structure 182 may be configured so as to be connected to the pressure plate 180 and be removable therefrom. In this case, the structure 181 may react with the material of the foil layer 120 upon applying heat 191 and the pressure 190, wherein the structure 182 connect to the layer 120 and may remain within the layer 120 upon removal of the pressure plate 180. In this case, the structure 182 may play the role of the excess material 122C, however, without being firmly associated to the layer 120 prior to the actual lamination process.

Consequently, at least one of the structures 122A, 122B, 122C and 182 may act as a pressure inducing structure in order to generate the increased pressure within the area 122, thereby obtaining the superior sealing effect, as discussed above.

Figure 1D:
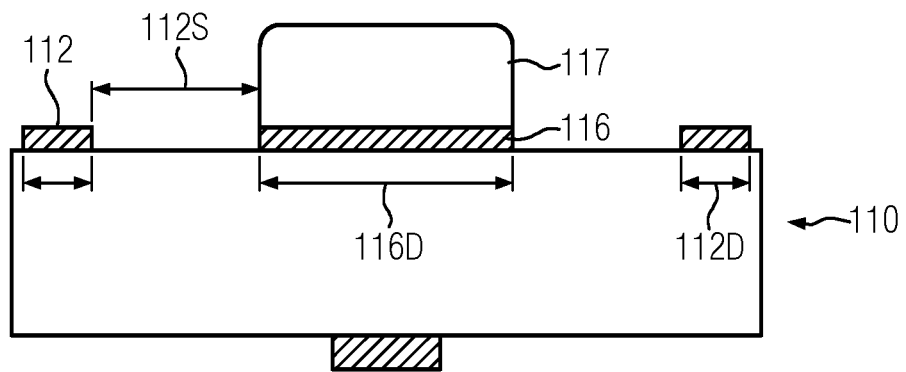

FIG. 1D schematically illustrates a cross-sectional view of a part of the layer 110 including the layer portion 115. As illustrated, the contact area 116 and the solder material 117 formed thereon are provided with appropriate lateral dimensions, as indicated by 116D, for instance having dimensions of several hundred μm (micrometer) to several mm (millimeter), depending on the device specific requirements. Similarly, a thickness of the contact area 116 that is formed of any appropriate conductive material, such as copper, aluminium, copper alloys, and the like, may be selected in accordance with device and process requirements. For example, typically a thickness of 10 μm to several ten μm may be selected.

Moreover, a pressure inducing structure 112 is formed on the layer portion 115 so as to laterally around the contact area 116, wherein the lateral dimension of the structure 112, indicated by 112D, may be selected in accordance with overall device and process requirements. For example, the lateral extension 112D may range from several ten μm to several hundred μm. Appropriate values for the thickness and the lateral dimension 112D may be selected on the basis of experiments, and the like, so as to obtain the desired sealing effect in combination with the layer 120, as discussed above in the context of FIGS. 1A to 1C.

In some embodiments, the pressure inducing structure 112 may be formed of the same material as the contact area 116, thereby enabling application of the contact area 116 and the pressure inducing structure 112 in one and the same process step. For example, the layer portion 115 may include an appropriate carrier material that may be coated by a conductive material of appropriate thickness and conductivity, such as copper, and the like, and the respective layer may be patterned on the basis of lithography and etch techniques or by any other patterning techniques. In other cases, one or more appropriate precursor materials may be deposited in a selective manner, for instance by any type of printing techniques, and the actual conductive material, such as copper, may be deposited by electrochemical selective deposition techniques, and the like. Hence, upon forming the pressure inducing structure 112 together with the contact area 116 no additional process steps are required and therefore a highly efficient overall manufacturing process may be accomplished.

In other illustrative embodiments the pressure inducing structure 112 may be formed as a separate component and may be attached to the layer portion 115 at any appropriate manufacturing stage. For example, a metal material, a plastic material of reduced compressibility or increased density, and the like may be pre-processed so as to obtain the structure 112 having the appropriate lateral size and shape and may be connected to the portion 115 immediately prior to the lamination process or at any other appropriate phase of the manufacturing process prior to performing the lamination process.

Figure 1E:
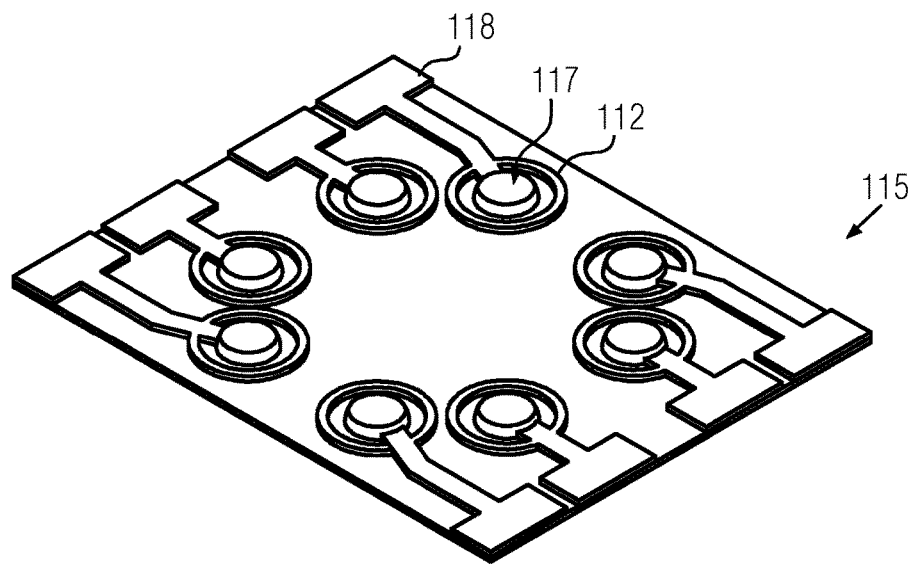

FIG. 1E schematically illustrates a perspective view of the layer portion 115 according to further illustrative embodiments. As shown, the layer portion 115 may include a plurality of contact areas (not shown) in combination with the solder material 117 and a conductor pattern 118 that provides for the electrical connection to the contact areas (not shown) and, thus, to the respective solder materials 117. The number of contact areas and portions of solder materials 117 and the structure of the conductor pattern 118 depend on the overall configuration of the respective device and are, therefore, selected so as to comply with the connectivity requirements for incorporating any electronic component into the corresponding foil layer stack. Furthermore, in the embodiment shown the respective pressure inducing structures 112 are provided for each of the respective solder materials 117 in the form of ring-type structures that surround the respective solder material 117. It should be appreciated that a part of the conductor pattern 118 connecting to the contact area and thus the solder material 117 may be considered as part of the pressure inducing structure 112, thereby providing for a non-interrupted pressure inducing structure, which may also be referred to herein as a seal structure. From another point of view, the connection from the contact area 116 to the remainder of the conductor pattern 118 may be considered as an interrupt region of the structure 112. In any rate, the function of providing increased pressure and thus superior sealing at the pressure inducing structure 112 is still intact.

It should be appreciated that the pressure inducing structure 112 is illustrated as a ring-type structure in order to laterally surround the solder material 117, which in turn may also typically be provided in the form of solder bump formed on a circular contact area, as for instance shown in the context of FIG. 1A. It should be appreciated, however, that the pressure inducing structure 112, and also the pressure inducing structures 122A, 122B, 122C and 182, as described in the context of FIG. 1C, may have any appropriate geometric configuration, as long as efficient lateral enclosure of the respective contact area is achieved. The same holds true for the contact area, which may also be provided in the form of any appropriate geometric configuration. For example, the respective pressure inducing structures may have the shape of a triangle, a rectangle, a square, polygon, and the like. The geometric configuration of the contact area 116 and of the associated pressure inducing structure or seal structure 112, 122B, 122C, 182 may be different. For example, a circular contact area may laterally be enclosed by a triangular, a rectangular, square-like, polygon-like structure, and vice versa.

Figure 2:
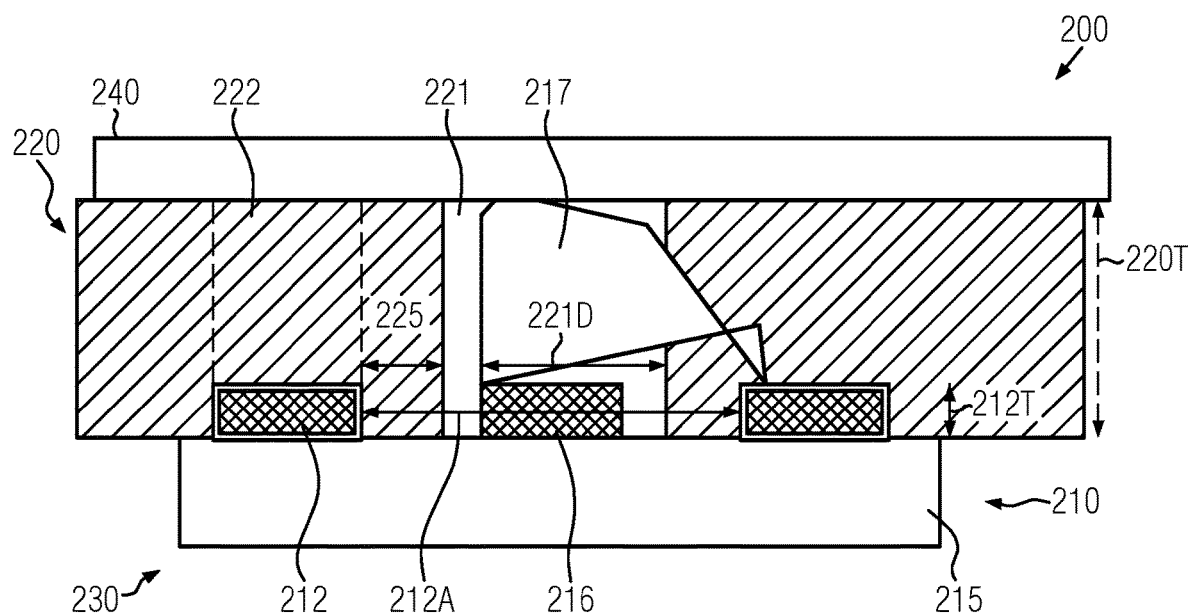
FIG. 2 schematically illustrates a cross-sectional view of a foil layer stack with superior solder material confinement according to still further illustrative embodiments.

FIG. 2 schematically illustrates a cross-sectional view of a foil layer stack 200 according to further illustrative embodiments. As shown, the foil layer stack 200 may include a first foil layer 210 having incorporated therein a layer portion 215, on which may be formed a contact area 216, which in turn may have formed thereon a solder material 217. With respect to the characteristics of the first foil layer 210 it is also referred to the embodiments as discussed above. That is, for example the layer portion 215 may represent a flexible carrier material for forming thereon or therein an appropriate conductor pattern including the contact area 216 as required by design criteria of the layer stack 200. The remaining portion of foil layer 210 may be provided in the form of any appropriate plastic material, such as PVC, polycarbonate, and the like.

The layer portion 215 may include a pressure inducing structure 212, for instance provided in the form of the conductive material having the same characteristics as the material used for forming the contact area 216.

Furthermore, the layer stack 200 may include a second foil layer 220 provided in the form of any appropriate material, such as PVC, polycarbonate, and the like. As previously discussed, in some illustrative embodiments, it is advantageous to provide polycarbonate or similar polymer materials that require a relatively high temperature during a lamination process, which may exceed the melting temperature of the solder material 217.

The second foil layer 220 may include an opening 221 so as to expose the solder material 217, as also discussed above.

As shown, a lateral dimension 221D of the opening 221 is selected so as to expose the solder material 217 and thus the dimension 221D is selected to be larger than the corresponding dimension of the contact area 216 and the solder material 217 prior to the reflowing of the material 217. On the other hand, the dimension 221D is selected such that a certain overlap portion 225 is provided in combination with the pressure inducing structure 212.

Moreover, in the example shown, a further foil layer 230 may be positioned "below" the first foil layer 210 and may be provided in the form of any appropriate material. Moreover, a further foil layer 240 made of any appropriate material may be formed "above" the second foil layer 220. In the embodiment shown, a thickness or height 220T of the second foil layer is selected so as to be equal to an initial height of the solder material 217 or slightly greater so as to avoid generation of increased pressure on the solder material 217 during a lamination process.

Upon applying heat and external pressure to the stack 200 an area of increased pressure 222, the basic shape and position may be defined by the pressure inducing structure 212, may be created and therefore the material of the second foil layer 220 within the area 222 may be compressed with increased pressure compared to the surrounding material of the layer 220, thereby also forming a portion of increased material density in the area 222. However, at the interface between the layer portion 215 and the layer 220, in particular at the interface between the pressure inducing structure 212 and the material of the layer 220, i.e. the area 222, a sealing effect is achieved due to the increased contact force in this region. Therefore a potential flow path of melted solder material 217 may efficiently be blocked by the superior sealing effect. Furthermore, due to the overlapping portion 225 a respective lateral confinement for the melted solder material 217 may be achieved. Consequently, a respective solder bump may be obtained, the lateral size and shape of which may substantially be defined by the final lateral size and shape of the opening 221.

It should be appreciated that the final lateral dimension 221D of the opening 221 may depend on the process conditions and the material characteristics, since typically during the lamination process the material of the layer 220 may undergo a certain lateral "flow" so that the lateral dimension 221D at the end of the lamination process may differ from a respective lateral dimension at the beginning of the lamination process. Any such changes of lateral dimensions, however, may readily be determined in advance, for instance by experiment, and the like, and may be taken into consideration upon forming the opening 221 in the layer 220. Therefore, the lateral size and shape of the solder material 217 after reflowing during the lamination process may be defined with a high degree of repeatability for any number of contact elements and also across a plurality of layer stacks 200, which are typically processed during a common lamination process.

In the example shown, the layers 230, 240 are illustrated as additional foil layers, which are also subjected to the lamination process in combination with the first and second foil layers 210, 220. In other cases, one or both of these layers may represent a "pressure plate", as previously discussed. For example, the layer 240 may represent a pressure plate so that the solder material 217 may be confined by the layer portion 215, the opening 221, i.e., by the inner side walls thereof, and the pressure plate, wherein, if considered appropriate, the top of the solder material 217 may be covered by solder plastic material, such as freefilm, hotmelt, thermoplastic, and the like. Furthermore, any of the techniques described above in the context of FIGS. 1A to 1E with respect to obtaining the superior sealing effect on the basis of the area of increased pressure 222 may also be applied additionally or alternatively to the usage of the pressure inducing structure 212.

Consequently, after completion of the lamination process the area of increased pressure 222 is formed into a high-density portion, i.e., a portion of increased density of the material compared to material outside of this area, such as the material corresponding to the overlap portion 225. Therefore, even if providing the area of increased pressure 222 on the basis of a temporarily used pressure inducing structure, as for instance discussed the context of FIG. 1C the increased pressure in the area 222 may nevertheless result in an increased local material density and in a superior sealing effect, even if the pressure inducing structure 212 is omitted, thereby leaving the area 222 as a portion of increased density.

As a result, the present invention provides methods and foil layer stacks, in which flow paths of a liquefied solder material during the lamination process may efficiently be blocked by forming a "seal" in combination with material of the overlaying foil layer that laterally confines the melted solder material. Therefore, increases flexibility may be achieved in combining solder materials with foil layer materials, since the lamination process is no longer restricted to temperatures that are below the melting temperature of the solder material.

The invention claimed is:

1. A method of forming a laminated foil layer stack, the method comprising:
   providing a first foil layer including a layer portion with a contact area having formed thereon a solder material,
   positioning a second foil layer adjacent to said first foil layer so as to form a layer stack, said second foil layer having an opening extending through the second foil layer and exposing said solder material,
   defining an area of increased pressure locally in said second foil layer, said area of increased pressure laterally surrounding said opening, and
   applying pressure and heat to said first and second foil layers so as to build up increased pressure in said area of increased pressure, and laminate said second foil layer to said first foil layer with said area of increased pressure laterally confining said solder material.

2. The method of claim 1, wherein a temperature of said solder material upon applying pressure and heat to said first and second foil layers exceeds a melting temperature of said solder material.

3. The method of claim 1, wherein defining an area of increased pressure locally in said second foil layer comprises providing a pressure inducing structure that has increased thermal and mechanical strength compared to a base material of said second foil layer.

4. The method of claim 3, wherein providing said pressure inducing structure comprises forming said pressure inducing structure by modifying a portion of at least one of said first and second foil layers so as to establish said increased thermal and mechanical strength prior to applying heat and pressure to said first and second foil layers.

5. The method of claim 3, wherein providing said pressure inducing structure comprises positioning said pressure inducing structure in and/or adjacent to said second foil layer.

6. The method of claim 5, wherein said pressure inducing structure is temporarily positioned above said second foil layer and is removed after lamination of said second foil layer to said first foil layer.

7. The method of claim 3, wherein providing said pressure inducing structure comprises positioning said pressure inducing structure on said first foil layer.

8. The method of claim 7, wherein providing said pressure inducing structure comprises commonly forming said pressure inducing structure and a conductor pattern of said layer portion of said first foil layer in a same process.

9. The method of claim 1, further comprising determining in advance a final lateral size and shape of said opening so as to determine lateral dimensions of said solder material after having applied pressure and heat.

* * * * *